United States Patent
Kanehiro et al.

(10) Patent No.: US 10,401,665 B2
(45) Date of Patent: Sep. 3, 2019

(54) METHOD OF PRODUCING DISPLAY PANELS

(71) Applicant: Sharp Kabushiki Kaisha, Sakai, Osaka (JP)

(72) Inventors: Masayuki Kanehiro, Sakai (JP); Youhei Nakanishi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 54 days.

(21) Appl. No.: 15/575,584

(22) PCT Filed: May 20, 2016

(86) PCT No.: PCT/JP2016/064980
§ 371 (c)(1),
(2) Date: Nov. 20, 2017

(87) PCT Pub. No.: WO2016/190231
PCT Pub. Date: Dec. 1, 2016

(65) Prior Publication Data
US 2018/0356670 A1      Dec. 13, 2018

(30) Foreign Application Priority Data
May 27, 2015   (JP) ................................ 2015-107564

(51) Int. Cl.
*G02F 1/1333*   (2006.01)
*G02F 1/1335*   (2006.01)
(Continued)

(52) U.S. Cl.
CPC .. *G02F 1/133308* (2013.01); *G02F 1/133351* (2013.01); *G02F 1/133514* (2013.01);
(Continued)

(58) Field of Classification Search
CPC .......................... G02F 1/133351; G02F 1/1341
See application file for complete search history.

(56) References Cited

U.S. PATENT DOCUMENTS

| | | | | |
|---|---|---|---|---|
| 2002/0044241 | A1* | 4/2002 | Matsuo | G02F 1/1333 349/113 |
| 2011/0223839 | A1* | 9/2011 | Jung | B24B 9/065 451/28 |
| 2014/0370240 | A1* | 12/2014 | Liu | G02F 1/1333 428/141 |

FOREIGN PATENT DOCUMENTS

| | | |
|---|---|---|
| JP | 11-326881 A | 11/1999 |
| JP | 2004-151551 A | 5/2004 |
| JP | 2006-293045 A | 10/2006 |

OTHER PUBLICATIONS

Official Communication issued in International Patent Application No. PCT/JP2016/064980, dated Jul. 26, 2016.

* cited by examiner

*Primary Examiner* — Phu Vu
(74) *Attorney, Agent, or Firm* — Keating & Bennett, LLP

(57) ABSTRACT

A producing method includes a sealing agent portion disposing process of disposing sealing agent portions 40, a part of which is cut off, on one 30A of substrates, a bonding process of bonding the substrates 20A, 30A via the sealing agent portions 40, a first cutting process of cutting a bonded substrate into pieces each having thin film patterns arranged linearly, a liquid crystal injection process of collectively injecting liquid crystals 18A into a space within each of the sealing agent portions 40 through inlets 40A, a sealing process of sealing the inlets 40A with sealing resin, a second cutting process of cutting each piece of the bonded substrate into bonded substrate pieces, and a grinding process of collectively grinding the substrates included in the bonded substrate pieces that are outside the thin film patterns along
(Continued)

an outline such that edge surfaces of the liquid crystal panels having curved outlines are collectively formed.

5 Claims, 13 Drawing Sheets

(51) Int. Cl.
*H01L 27/12* (2006.01)
*G02F 1/1339* (2006.01)
*G02F 1/1345* (2006.01)
*G02F 1/1341* (2006.01)

(52) U.S. Cl.
CPC ........ *H01L 27/1214* (2013.01); *G02F 1/1339* (2013.01); *G02F 1/1341* (2013.01); *G02F 1/13452* (2013.01); *G02F 2001/13456* (2013.01); *G02F 2201/56* (2013.01)

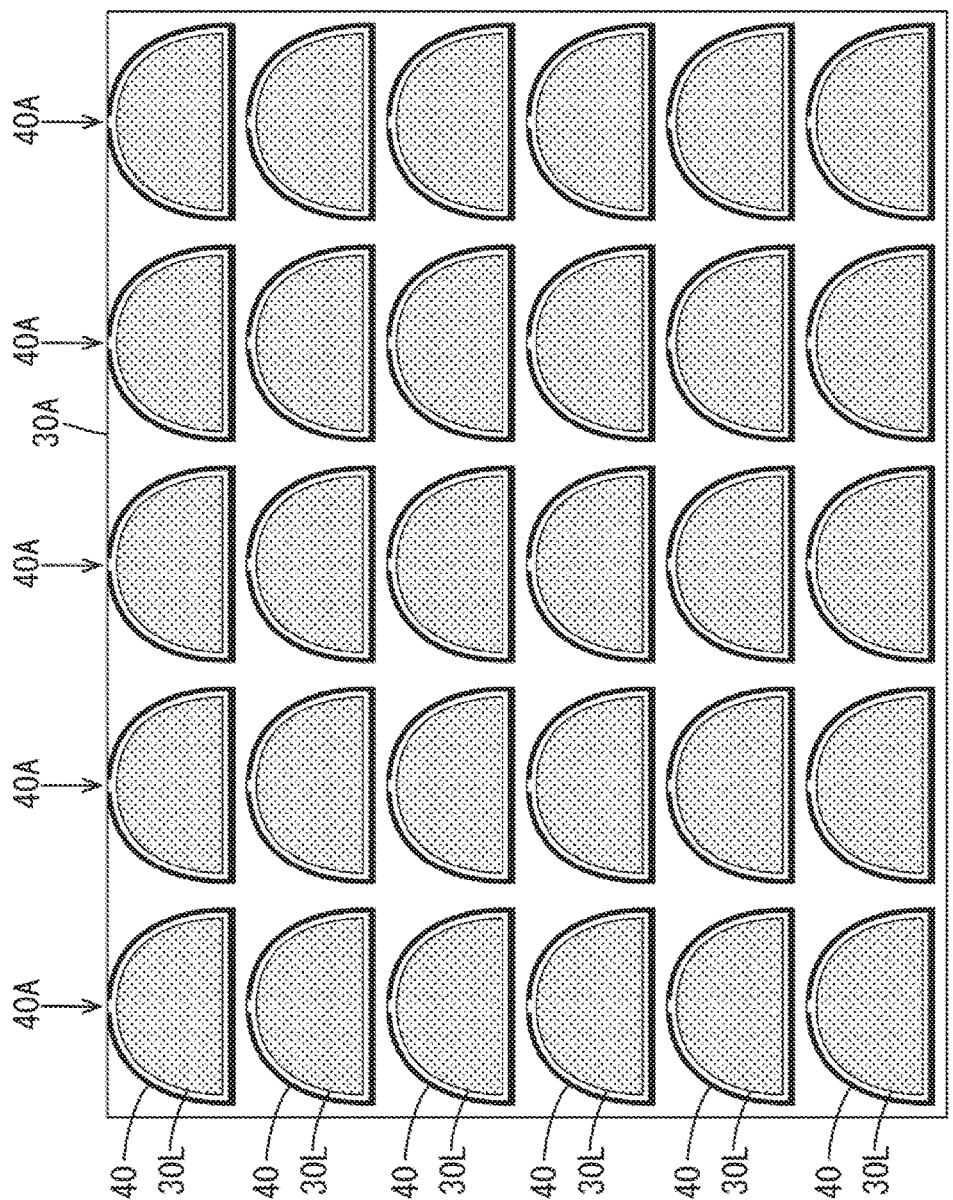

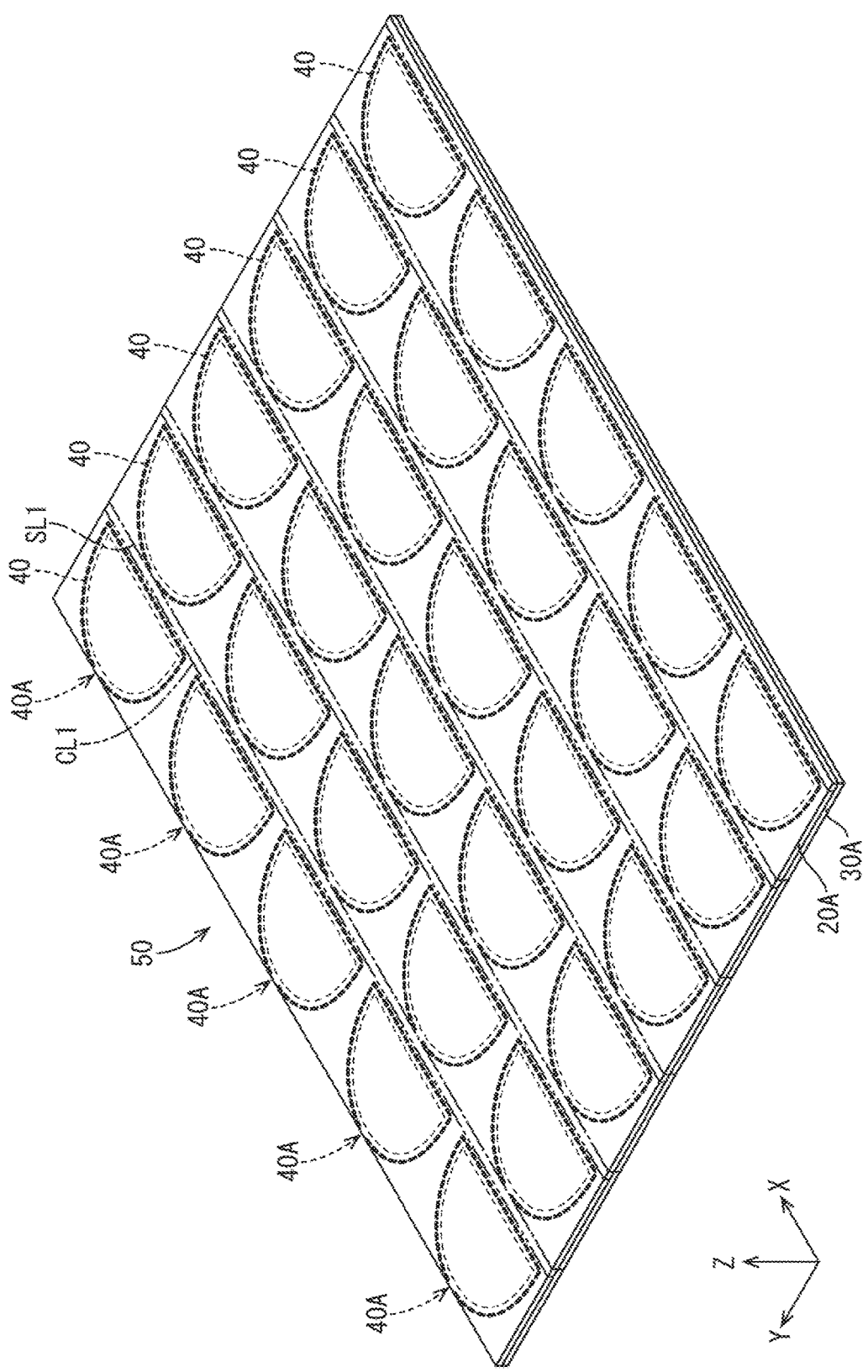

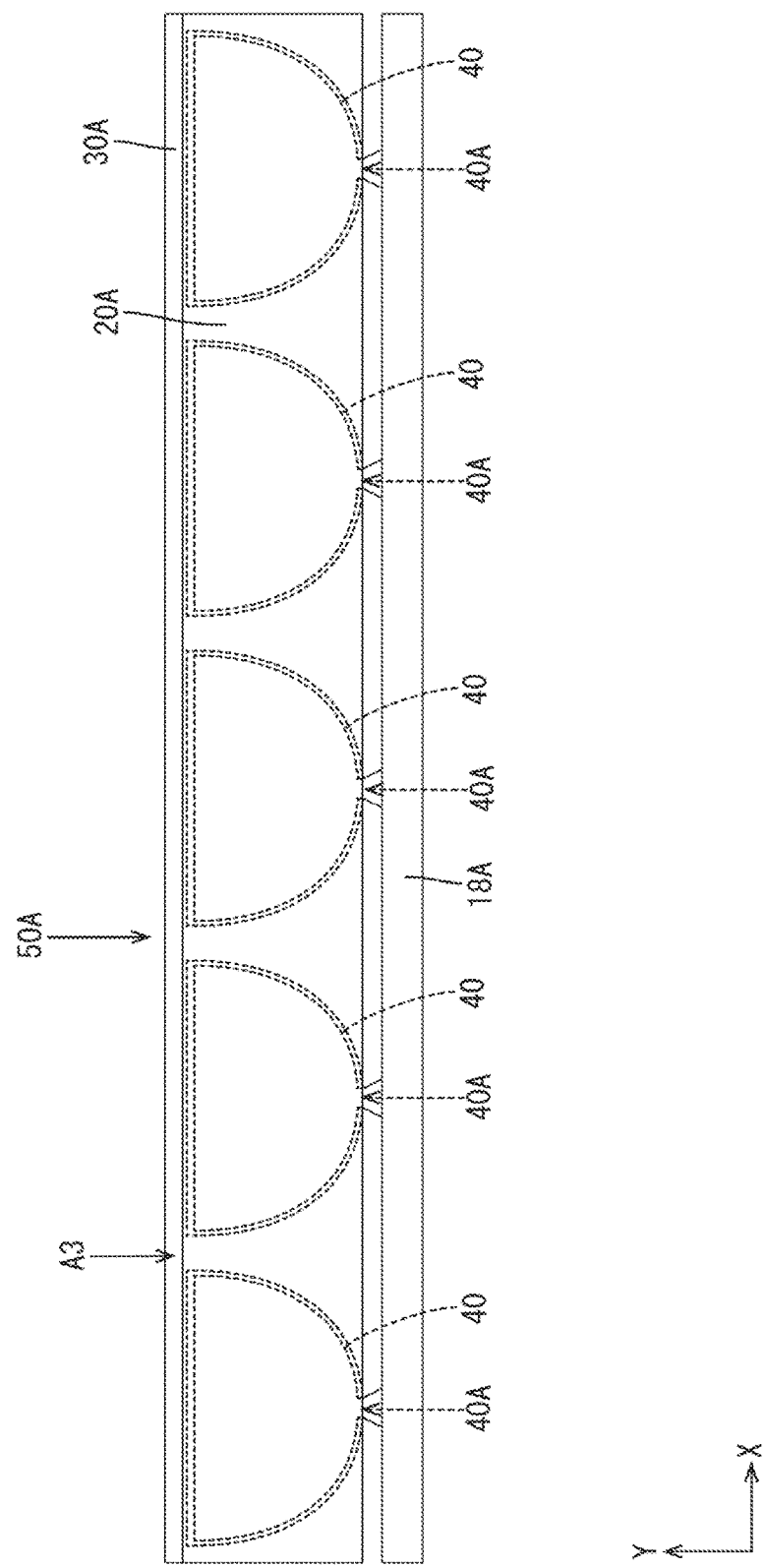

METHOD OF PRODUCING DISPLAY PANELS

TECHNICAL FIELD

The present technology relates to a method of producing display panels.

BACKGROUND ART

A method of producing a display panel such as a liquid crystal panel included in a display device as described below has been known. A pair of substrates one of which includes a thin film pattern of semiconductor elements such as thin film transistors (TFTs) are bonded to each other and a bonded substrate is formed. The bonded substrate is cut along an outline of the display panel and a display panel is produced.

A display panel produced with the above producing method generally has a front view of a square outline or a rectangular outline. Recently, according to variety of usage of the display panels, display panels having a non-rectangular outline such as an outline a part of which is curved have been produced. For example, Patent Document 1 discloses a method of producing a liquid crystal panel including a substantially ellipsoidal display area and, that is, a non-rectangular outline shape.

RELATED ART DOCUMENT

Patent Document

Patent Document 1: Japanese Unexamined Patent Application Publication No. 2006-293045

Problem to be Solved by the Invention

However, in the method of producing liquid crystal panels described in Patent Document 1, a mother substrate including multiple panel areas for the liquid crystal panels is immersed in a liquid crystal tank such that liquid crystals are injected into each of the panel areas. Then, the mother substrate is cut into multiple pieces for each of the panel areas and each panel area piece is subjected to processing of an edge surface thereof that forms a part of the outline of the liquid crystal panel. Thus, the liquid crystal panels having non-rectangular outlines are produced. Therefore, if the mother substrate includes a large number of panel areas, it takes long time to finish the processing of the edge surfaces of all of the panel areas and a process of producing the liquid crystal panels may be long.

Further, in the method of producing the liquid crystal panels described in Patent Document 1, the edge surface of each panel area that forms the outline of the liquid crystal panel is processed with a scribing method. Therefore, if the liquid crystal panel to be produced has a curved outline and the edge surface having a complicated outline shape is to be processed, cracks are likely to be produced on the edge surface to be processed due to a stress caused by the scribing. It is difficult to produce the liquid crystal panels having a complicated outline with high precision.

DISCLOSURE OF THE PRESENT INVENTION

The present technology was made in view of the above circumstances. An object is to shorten a process of producing a display panel including a liquid crystal layer and producing collectively display panels each having a curved outline with high precision.

Means for Solving the Problem

The technology described in this specification is a method of collectively producing display panels each having an outline a part of which is curved, each of the display panels including substrates and a liquid crystal layer disposed on inner surface sides of the respective substrates, and the method includes a sealing agent disposing process of preparing the substrates in a pair one of which has thin film patterns, and disposing sealing agent portions on the one of the substrates to surround the respective thin film patterns and a part of each of the sealing agent portions being cut off, a bonding process of bonding the substrates via the sealing agent portions and forming a bonded substrate after the sealing agent disposing process, a first cutting process of cutting the bonded substrate into first separated bonded substrate pieces each of which is elongated and includes the thin film patterns linearly arranged, the first cutting process being performed after the bonding process, a liquid crystals injection process of collectively injecting liquid crystals for forming the liquid crystal layer to inside of the sealing agent portions through inlets that are cut off parts of the sealing agent portions surrounding the respective thin film patterns that are linearly arranged, the liquid crystals injection process being performed after the first cutting process, a sealing process of sealing the inlets of the respective sealing agent portions with sealing resin after the liquid crystals injection process, a second cutting process of cutting each of the first separated bonded substrate pieces obtained in the first cutting process into second separated bonded substrate pieces each including a single one of the thin film patterns, the second cutting process being performed after the sealing process, and a grinding process of collectively grinding the substrates in a pair that are outside the thin film pattern on each of the separated bonded substrate pieces along the outline and collectively forming edge surfaces of the display panels each having the curved outline, the grinding process being performed after the sealing process.

According to the above-described producing method, in the bonding process, the substrates are bonded to each other via the sealing agent portions each of which is partially cut off. In the first cutting process, the bonded substrate is cut into first separated bonded substrate pieces each of which includes thin film patterns that are arranged linearly. In the grinding process thereafter, portions of the substrates that are outside the thin film patterns on the first separated bonded substrates are collectively ground along the outlines of the display panels to be produced. Accordingly, the edge surfaces of the display panels having curved outlines are collectively formed. Therefore, the process of producing the display panels each having the liquid crystal layer is shortened compared to the configuration in which the liquid crystals are injected into a space within each of the sealing agent portions disposed on a bonded substrate one by one and the bonded substrates are processed one by one to form the edge surfaces of the liquid crystal panel.

The first separated bonded substrates are collectively ground to form the edge surfaces of the display panels having curved outlines. Therefore, unintentional cracks are less likely to be produced near the edge surfaces and each of the display panels to be produced has an outline with good precision. As described before, in the method of producing the display panels including the liquid crystal layers, the display panels having curved outlines with good precision are collectively produced while shortening the producing process.

In the above method of producing the display panels, in the grinding process, in a part of the bonded substrate where the substrates in a pair and the sealing agent portions are overlapped with each other in a plan view, the substrates and the sealing agent portions may be collectively ground along the outline such that ground surfaces of the substrates in a pair and ground surfaces of the sealing agent portions are aligned with each other.

According to the above-described producing method, the substrates and the sealing agent portions are collectively ground such that ground surfaces of the substrates in a pair and ground surfaces of the sealing agent portions are aligned with each other. The width dimension of the sealing agent portions is small at the curved edge surfaces of the display panels and therefore, the display panels to be produced have a reduced frame width.

In the above producing method, in the sealing process, the sealing resin may be put in the inlets of the sealing agent portions so as to be extended to inside of the sealing agent portions.

According to the above-described producing method, the sealing resin is put in the inlets and also provided inside the sealing agent portions. Therefore, if a part of the edge surfaces of the sealing resin is ground in the grinding process, the sealing at the inlets of the sealing agent portions is likely to be kept. The liquid crystals are less likely to leak out of the display panel after producing of the display panel.

In the above method of producing the display panels, the display panel may include a mounting area where driving components for driving the display panel are mounted and that is included in a part of a panel surface area thereof, and in the first cutting process, a cut line may be formed at a border between the mounting area and another area in the panel surface area of the one substrate, and a part of the one substrate may be removed from each of the first separated bonded substrate pieces along the cut line.

According to the above-described producing method, the cut line is formed on the one substrate and a part of the one substrate is removed along the cut line from the bonded substrate. Thus, the mounting area of the display panel to be produced is provided without performing the cutting operation for producing the mounting area after the grinding process. Therefore, according to the producing method, the display panels having the mounting areas for driving components and having a curved outline are collectively produced.

The method of producing the display panels may further include a layering process of layering the separated bonded substrate pieces via curing resin and curing the curing resin and forming a layered substrate, the layering process being performed after the liquid crystals injection process and before the grinding process, and a separation process of separating each of the separated bonded substrate pieces included in the layered substrate from the curing resin, the separation process being performed after the grinding process. In the grinding process, in each of the separated bonded substrate pieces, the substrates in a pair and the curing resin that are outside the thin film patterns may be ground collectively along the outline.

According to the above-described producing method, in the grinding process, the layered substrate including the separated bonded substrates that are layered on each other is ground, and in the subsequent separation process, each of the separated bonded substrates of the layered substrate is separated from the curing resin. Therefore, the process of producing the display panels is further shortened compared to the method of processing the separated bonded substrates one by one and to form each of the edges of the display panels.

In the above method of producing the display panels, the layered substrate may be cut into separated layered substrate pieces in the second cutting process.

Advantageous Effect of the Invention

According to the technology described in this specification, a process of producing display panels including a liquid crystal layer is shortened and display panels having a curved outline are collectively produced with high precision.

BRIEF DESCRIPTION OF THE DRAWINGS

FIG. 5 is a plan view illustrating a bonding process.

FIG. 6 is a perspective view illustrating a bonded substrate before a first cutting process.

FIG. 7 is a plan view illustrating a liquid crystals injection process.

MODES FOR CARRYING OUT THE INVENTION

First Embodiment

Figure 1:
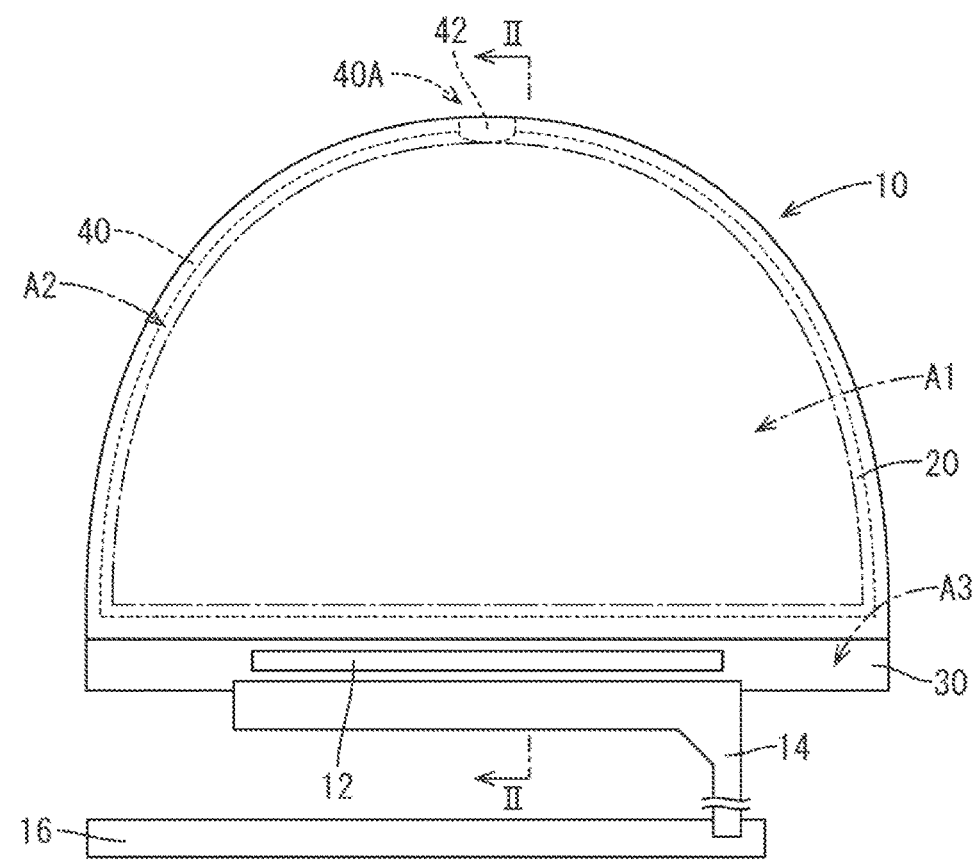
FIG. 1 is a schematic plan view illustrating a liquid crystal panel according to a first embodiment.

A first embodiment will be described with reference to FIGS. 1 to 9. In the present embodiment, a method of producing a liquid crystal panel (an example of a display panel) 10 included in a liquid crystal display device will be described. X-axis, Y-axis and Z-axis may be indicated in the drawings and the axes in each drawing correspond to the respective axes in other drawings. An upper side in FIGS. 2, 6, 8, and 9 corresponds to an upper side (a front side) of the liquid crystal panel 10.

A configuration of the liquid crystal panel 10 will be described. The liquid crystal panel 10 of the present embodiment does not have a general outline plan view shape such as a rectangular shape or a square shape but has an outline a part of which is curved and has a non-rectangular overall shape. Specifically, as illustrated in FIG. 1, the plan view outline shape of the liquid crystal panel 10 is a substantially semi-circular shape. In FIG. 1, the liquid crystal panel 10 has a straight outline of the whole outline shape and the straight outline extends in the X-axis direction.

The liquid crystal panel 10 includes a laterally elongated display area A1 in most area thereof and images appear on the display area A1. An area of the liquid crystal panel 10 outside the display area A1 is a non-display area A2 in which images are not displayed. The non-display area A2 includes a frame portion surrounding the display area A1 that is a frame portion of the liquid crystal panel 10. The non-display area A2 includes a mounting area A3 in which an IC chip (an example of a driving component) 12 and a flexible printed circuit board 14 are mounted. The mounting area A3 is locally close to one edge portion of the liquid crystal panel 10 with respect to the Y-axis direction (on a lower side in FIG. 1). The IC chip 12 is an electronic component that drives the liquid crystal panel 10 and a control board 16 that supplies various input signals from the outside to the IC chip 12 is connected to the liquid crystal panel 10 via the flexible circuit board 14. As illustrated in FIG. 1, the mounting area A3 of this embodiment is a laterally elongated rectangular area having a laterally elongated rectangular outline. The outline shape has long sides extending linearly along the X-axis and short sides extending linearly along the Y-axis in FIG. 1.

Figure 2:
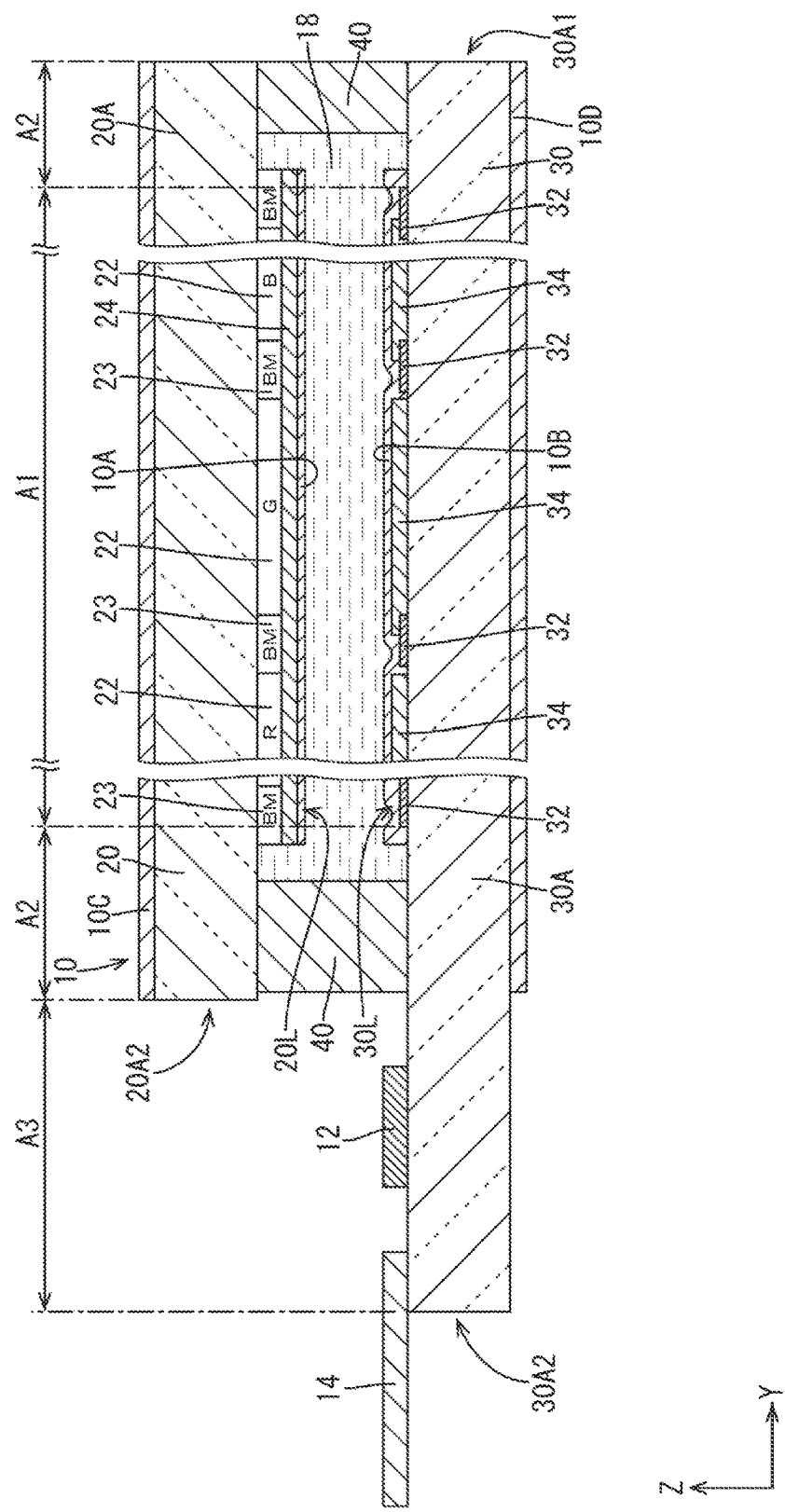
FIG. 2 is a schematic cross-sectional view of the liquid crystal display device illustrating a cross-sectional configuration taken along line II-II in FIG. 1.

As illustrated in FIGS. 1 and 2, the liquid crystal panel 10 includes a pair of glass substrates 20 and 30 having high transmissivity, and a liquid crystal layer 18 including liquid crystal molecules having optical characteristics that vary according to application of electric field. The substrates 20 and 30 are bonded together with an ultraviolet cure sealing agent portion 40 with a cell gap of a thickness of the liquid crystal layer 18 therebetween. The liquid crystal layer 18 is inside the sealing agent portion 40. As illustrated in FIG. 1, the sealing agent portion 40 surrounding the liquid crystal layer 18 is partially cut off. And a cut-off portion is an inlet 40A through which liquid crystals 18A (see FIG. 7) that are to be the liquid crystal layer 18 are injected in the process of producing the liquid crystal panel 10. The inlet for the sealing agent is filled with sealing resin 42 and the liquid crystal layer 18 is enclosed inside the sealing agent portion 40.

The substrates 20 and 30 of the liquid crystal panel 10 include a color filter substrate 20 on the front (on a front surface side) and an array substrate 30 on a back side (on a rear surface side). Alignment films 10A and 10B are formed on inner surfaces of the substrates 20 and 30, respectively, for aligning the liquid crystal molecules included in the liquid crystal layer 18. Polarizing plates 10C and 10D are bonded to an outer surface of a first glass substrate (one example of substrates) of the color filter substrate 20 and an outer surface of a second glass substrate (one example of the substrates) of the array substrate 30.

The array substrate 30 and the polarizing plate 10C are bonded to a main portion of the first glass substrate 20A of the color filter substrate 20. As illustrated in FIG. 1, the color filter substrate 20 has an X-axis dimension substantially same as that of the array substrate 30 and has a Y-axis dimension smaller than that of the array substrate 30. The color filter substrate 20 and the array substrate 30 are bonded together such that one of the Y-axis edges (upper-side edges in FIG. 1, on an edge having an arched curved outline) thereof are aligned with each other. According to such a configuration, the color filter substrate 20 is not overlapped with a portion of the array substrate 30 in another one of the Y-axis edges (a lower-side edge in FIG. 1) over a certain area and the edge portion of the array substrate 30 is exposed outside on the front and rear plate surfaces thereof. Thus, the exposed portion is a mounting area A3 where the IC chip 12 and the flexible printed circuit board 14 are mounted.

The color filter substrate 20 and the polarizing plate 10D are bonded to a main portion of the second glass substrate 30A of the array substrate 30 and a portion of the array substrate 30 for the mounting area A3 where the IC chip 12 and the flexible printed circuit board 14 are mounted is not overlapped with the color filter substrate 20 and the polarizing plate 10D. The sealing agent portion 40 for bonding the substrates 20 and 30 of the liquid crystal panel 10 is disposed within the non-display area A2 of an overlapped portion where the substrates 20 and 30 are overlapped with each other. The sealing agent portion 40 is disposed to surround the display area A1 along the outline of the color filter substrate 20 (be in a substantially semicircular plan view form) (see FIG. 2).

Layered thin film patterns are formed on the inner surface side (the liquid crystal layer 18 side) of the second glass substrate 30A of the array substrate 30. Specifically, the thin film patterns of TFTs 32 that are switching components and thin film patterns of pixel electrodes 34 that are transparent conductive films such as indium tin oxide (ITO) and connected to the TFTs 32 are arranged in a matrix on the inner surface of the second glass substrate 30A of the array substrate 30. Furthermore, gate lines, source lines and capacitance lines (not illustrated) are arranged to surround the TFTs 32 and the pixel electrodes 34 on the array substrate 30. Terminals extended from each of the gate lines and the capacitance lines and terminals extended from the source lines are connected to the edge portion of the array substrate 30. Signals or reference potential is input from a control board 16 illustrated in FIG. 1 to each of the terminals and driving of the TFTs 32 is controlled.

As illustrated in FIG. 2, color filters 22 are arranged on the inner surface side (the liquid crystal layer 18 side) of the first glass substrate 20A of the color filter substrate 20. The color filters 22 are arranged in a matrix while overlapping the respective pixel electrodes 34 of the array substrate 30 in a plan view. The color filters 22 include red (R), green (G), and blue (B) color portions. A light blocking portion (black matrix) 23 is formed between the color portions included in the color filters 22 for reducing color mixture. The light blocking portion 23 is arranged to overlap the gate line, the source lines, and the capacitance lines in a plan view. In the liquid crystal panel 10, the R (red) color portion, the G (green) color portion, the B (blue) color portion, and three pixel electrodes 34 opposed to the respective color portions form a display pixel that is a display unit. Each display pixel includes a red pixel including the R color portion, a green pixel including the G color portion, and a blue pixel including the B color portion. The color pixels are repeatedly arranged along a row direction (the X-axis direction) on a plate surface of the liquid crystal panel 10 to form a pixel group. The pixel groups are arranged along the column direction (the Y-axis direction).

As illustrated n FIG. 2, a counter electrode 24 is disposed on inner surfaces of the color filter 22 and the light blocking portion 23 to be opposed to the pixel electrodes 34 on the array substrate 30 side. Counter electrode lines, which are not illustrated, are arranged in the non-display area of the liquid crystal panel 10. The counter electrode lines are connected to the counter electrode 24 via a contact hole.

Reference potential is applied to the counter electrode 24 from the counter electrode lines and the potential to be applied to the pixel electrodes 34 is controlled by the TFTs 32 to produce potential difference between the pixel electrodes 34 and the counter electrode 24.

As illustrated in FIG. 2, on an edge surface of the liquid crystal panel 10 of this embodiment having a linear outline (a left side edge surface in FIG. 2, hereinafter referred to as a linear edge surface), the pair of glass substrates 20A, 30A extends slightly further toward outside the sealing agent portion 40. On the edge surface (an edge surface on the right side in FIG. 2, hereinafter referred to as a curved edge surface) having a curved outline shape, the edge surfaces of the glass substrates 20A and 30A are aligned with an edge surface of the sealing agent portion 40. As illustrated in FIG. 2, a width dimension of the sealing agent portion 40 on the curved edge surface (a Y-axis dimension) is smaller than a width dimension of the sealing agent portion 40 on the linear edge surface. Accordingly, a frame having a small width dimension is achieved.

Figure 3:
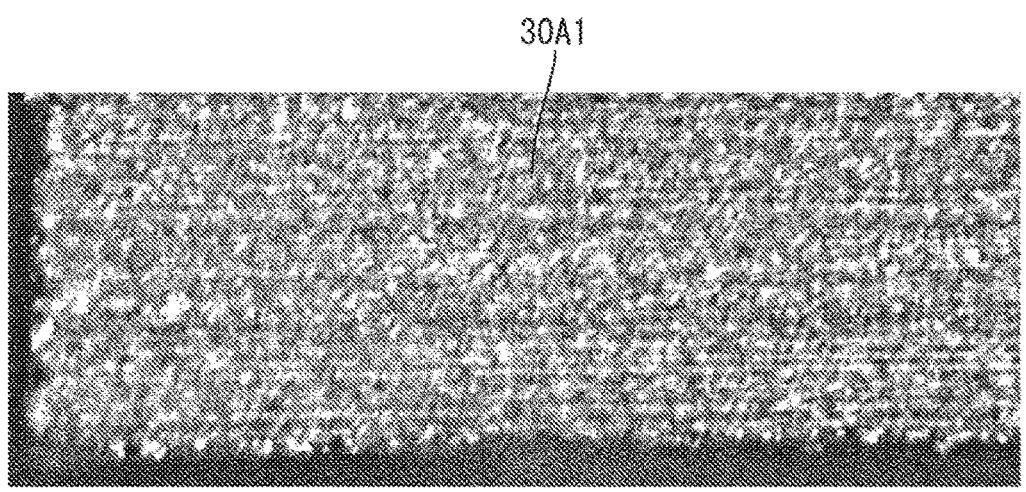
FIG. 3 is a picture of a cross-sectional view of a processed surface of a glass substrate that is subjected to a grinding process with a grinder.

As will be described later, the curved edge surface of the liquid crystal panel 10 is formed with grinding process in which the glass substrates 20A, 30A and the sealing agent portions 40 are collectively ground with a grinder and therefore, the edge surfaces of the glass substrates 20A and 30A and the edge surface of the sealing agent portion 40 are aligned with each other on the curved edge surface of the liquid crystal panel 10, as described above. Therefore, as illustrated in FIG. 3, a processed cut surface 30A1 of the second glass substrate 30A on the curved edge surface is a cut surface of a frosted glass (a processed cut surface of the first glass substrate 20A has the same cut surface).

Figure 4A:
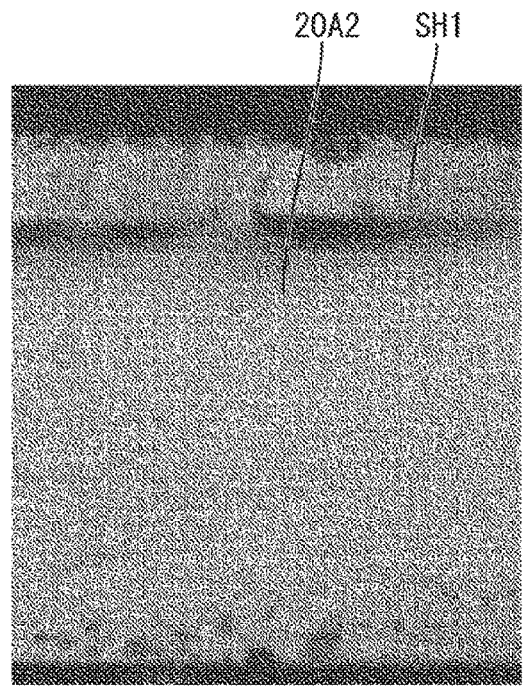
FIG. 4A is a picture of a cross-sectional view of a processed surface of a first glass substrate that is subjected to a cutting process with scribing.
Figure 4B:
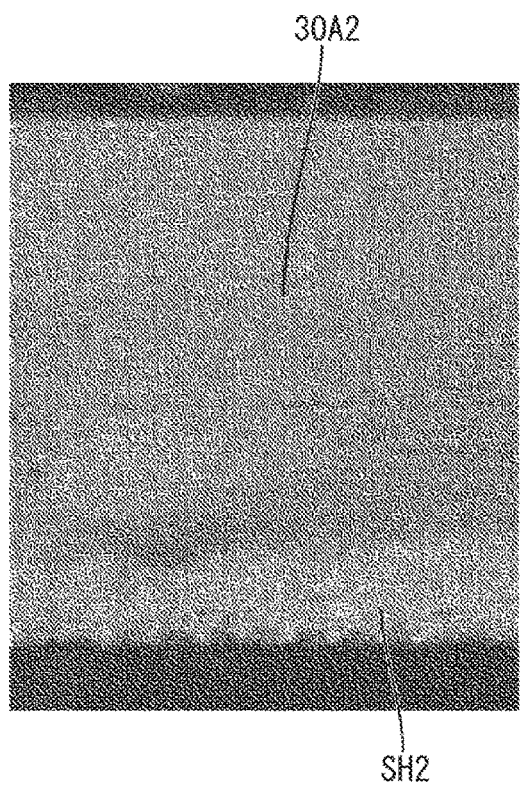
FIG. 4B is a picture of a cross-sectional view of a processed surface of a second glass substrate that is subjected to a cutting process with scribing.

The linear edge surface of the liquid crystal panel 10 is formed with cutting processing in which each of the glass substrates 20A and 30A is cut with scribing, as will be described later. Therefore, as illustrated in FIG. 4A, on a processed cut surface 20A2 of the first glass substrate 20A on the linear edge surface, a wheel trace SH1 caused by a scribing wheel remains and other portion has a cut surface of a mirror surface. As illustrated in FIG. 4B, on a processed cut surface 30A2 of the second glass substrate 30A on the linear edge surface, a wheel trace SH2 caused by the scribing wheel remains and other portion has a cut surface of a mirror surface.

The liquid crystal panel 10 has the above-described configuration and a method of producing collectively multiple liquid crystal panels 10 including the liquid crystal layer 18 as described before will be described next. Hereinafter, the configuration formed on the first glass substrate 20A except for the alignment film 10A is referred to as a CF layer (an example of a thin film pattern) 20L and the configuration formed on the second glass substrate 30A except for the alignment film 10B is referred to as a TFT layer (an example of a thin film pattern) 30L.

In the process of producing the liquid crystal panel 10 according to this embodiment, the first glass substrate 20A to be the color filter 20 and the second glass substrate 30A to be the array substrate 30 are prepared. The CF layer 20L is formed on one plate surface of the first glass substrate 20A and the TFT layer 30L is formed on one plate surface of the second glass substrate 30A. The CF layer 20L and the TFT layer 30L are formed on the first glass substrate 20A and the second glass substrate 30A, respectively, with a known photolithography method. The first glass substrate 20A and the second glass substrate 30A are transferred through a film forming device, a resist coating device, and an exposure device used with the photolithography method such that thin films for the CF layer 20L and the TFT layer 30L are layered sequentially in a predefined pattern.

In the producing method according to this embodiment, a bonded substrate 50 obtained by bonding the first glass substrate 20A and the second glass substrate 30A is cut twice to obtain small pieces in processes described below. Thus, thirty liquid crystal panels 10 are produced from one bonded substrate 50. The CF layer 20L is formed on each of thirty portions of the first glass substrate 20A and the TFT layer 30L is formed on each of thirty portions of the second glass substrate 30A (see FIG. 5). The CF layers 20L and the TFT layers 30L are formed in a matrix on the respective glass substrates 20A and 30A (five in the X-axis direction and six in the Y-axis direction in this embodiment) such that each of the CF layers 20L and each of the TFT layers 30L are opposite each other when bonding the glass substrates 20A and 30A.

Next, the alignment film 10A is disposed on the first glass substrate 20A and covers each of the CF layers 20L formed on the first glass substrate 20A, and the alignment film 10B is disposed on the second glass substrate 30A and covers each of the TFT layers 30L formed on the second glass substrate 30A. According to the above sequence, twenty four color filter substrates 20 are formed on the first glass substrate 20A and twenty four array substrates 30 are formed on the second glass substrate 30A. Next, the sealing agent portions 40 are disposed on the second glass substrate 30A to surround each of the TFT layers 30L on the second glass substrate 30A (see FIG. 5). In this process, as illustrated in FIG. 5, the sealing agent portion 40 is disposed along the outline (substantially a semicircular shape in this embodiment) of each of the liquid crystal panels 10 to be produced and disposed over a predefined width. As illustrated in FIG. 5, the sealing agent portion 40 is not provided on a middle portion of an arched coating area of the semicircular shape that is along the outline of the liquid crystal panel 10 to be produced. Namely, the sealing agent is disconnected at the middle portion of the arched coating area (a disconnected portion 40A in the sealing agent portion 40 in FIG. 5).

Next, the first glass substrate 20A and the second glass substrate 30A are positioned with each other such that the CF layers 20L formed on the first glass substrate 20A are opposite the TFT layers 30L formed on the second glass substrate 30A, respectively. Then, the glass substrates 20A and 30A are bonded with the sealing agent portions 40 and the bonded substrate 50 is obtained as illustrated in FIG. 6 (a bonding process). The bonding process is performed while the sealing agent portions 40 are irradiated with ultraviolet rays and heated. Accordingly, the sealing agent portions 40 are cured and the glass substrates 20A and 30A are fixed to each other with the sealing agent portions 40.

The bonded substrate 50, which is obtained as described before, includes an area where the CF layer 20 and the TFT layer 30L that are in a pair and opposite each other and the area is a panel region. As illustrated in FIG. 6, the bonded substrate 50 is defined into thirty panel regions. The cured sealing agent portion 40 and a thin film pattern (a portion inside the sealing agent portion 40 and surrounded by a thin dotted line in FIG. 6) that is arranged within the sealing agent portion 40 and includes the CF layer 20L and the TFT layer 30L are included in each panel region.

Next, as illustrated in FIG. 7, the bonded substrate 50 is divided into multiple bonded substrate pieces such that five panel regions are arranged linearly (the five thin film patterns are arranged linearly) on each of the bonded substrate pieces and the disconnected portion of the sealing agent portion 40 in each thin film pattern is exposed outside (a first cutting process). Hereinafter, each of separated bonded substrate pieces after the first cutting process is referred to as a first separated bonded substrate 50A. Specifically, in the first cutting process, the bonded substrate 50 illustrated in FIG. 6 is cut along lines (a dot and dash line extending in the X-axis direction in FIG. 6) that are scribing lines SL1 with scribing using a scribing wheel, which is not illustrated. Thus, the bonded substrate 50 is divided into six first separated bonded substrates 50A.

In the first cutting process, a linear cut line CL (a two dotted line extending in the X-axis direction in FIG. 6) is formed in each border portion between the mounting area A3 of each liquid crystal panel 10 to be produced and other areas on the first glass substrate 20A of the bonded substrate 50. After or at the same time as the bonded substrate 50 is cut into six pieces, a part of the first glass substrate 20A is removed from the bonded substrate 50 along each of cut lines CL1. Accordingly, as illustrated in FIG. 7, the mounting area A3 of the liquid crystal panel 10 to be produced is exposed.

Figure 8:
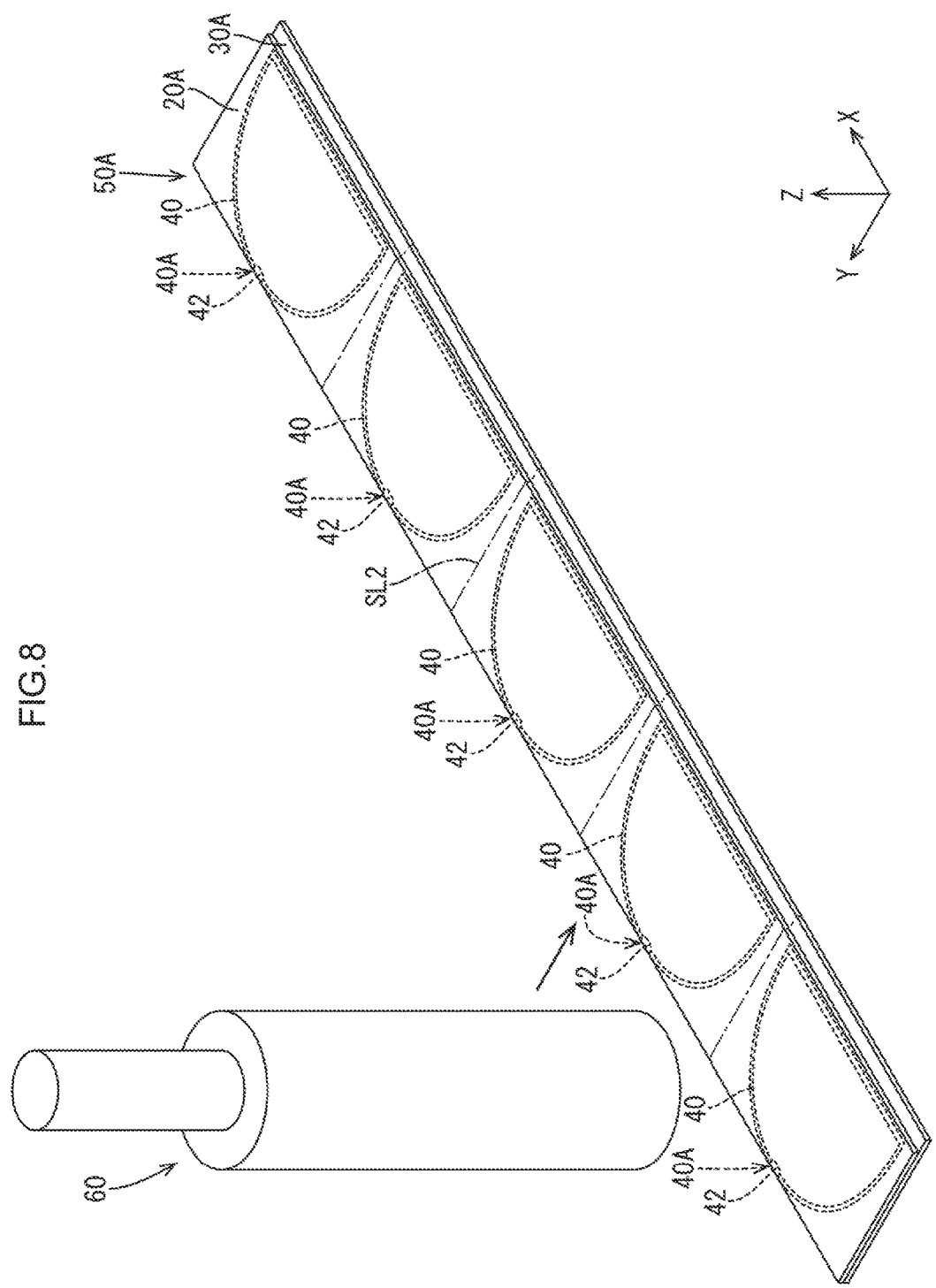
FIG. 8 is a perspective view illustrating a separated bonded substrate before a grinding process.
Figure 9:
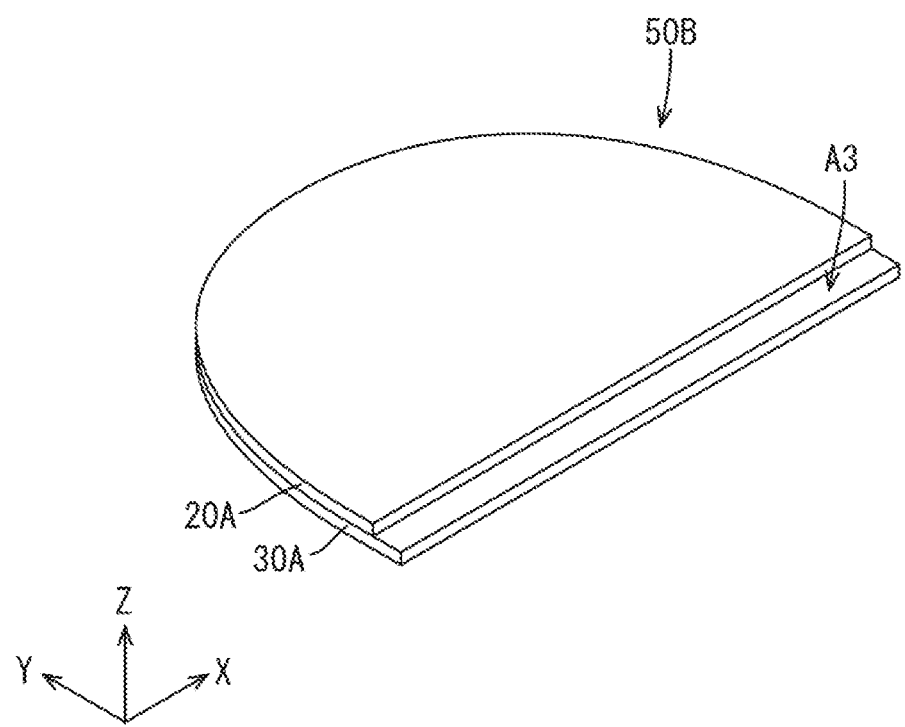
FIG. 9 is a perspective view illustrating a separated bonded substrate after the grinding process.

Each of the first separated bonded substrates 50A includes five thin film patterns that are linearly arranged. As illustrated in FIG. 7, the liquid crystals 18A for the liquid crystal layer 18 are collectively injected into the inside of the sealing agent portions 40 with vacuum injection through the inlets 40A of the five thin film patterns (a liquid crystals injection process). The inlet 40A is the disconnected portion of the sealing agent portion 40 surrounding each of the five thin film patterns that are arranged linearly. Then, as illustrated in FIG. 8, each of the inlets 40A of the sealing agent portions 40 on the first separated bonded substrate 50A is sealed with sealing resin 42 (a sealing process). Accordingly, the liquid crystals 18A injected through the inlets 40A spreads along plate surfaces of the glass substrates 20A and 30A and areas surrounded by the sealing agent portions 40 are filled with the liquid crystals 18A and the liquid crystal layers 18 are formed between the glass substrates 20A and 30A. In the sealing process, the sealing resin 42 is put inside the sealing agent portions 40 through the inlets 40A of the sealing agent portions 40 (see FIG. 1).

Next, as illustrated in FIG. 8, the curved edge surface of each liquid crystal panel 10 of the first separated bonded substrate 50A is ground with a grinder 60 (a grinding process). The grinder 60 is a device of rotating a grinding wheel for grinding an object to be processed. In the grinding process, portions of the glass substrates 20A and 30A that are outside the thin film patterns of each of the first separated bonded substrates 50A (one of the first separated bonded substrates 50A is illustrated in FIG. 8) are collectively ground along the outlines of the curved edge surfaces of the liquid crystal panels 10 to be produced. Specifically, in the grinding process, after the grinder 60 is moved and reaches a pair of glass substrates 20A, 30A and the sealing agent portions 40 that are overlapped with each other in a plan view, the pair of glass substrates 20A, 30A and the sealing agent portions 40 are collectively ground along the outline of the curved edge surfaces of the liquid crystal panels 10 to be produced such that grinding surfaces of the glass substrates 20A, 30A and the grinding surfaces of the sealing agent portions 40 are aligned with each other. The linear edge surfaces of the liquid crystal panels 10 to be produced are not ground.

In the grinding process, the pair of glass substrates 20A, 30A and the sealing agent portions 40 are ground such that the sealing resin 42 put in the inlets 40A of the sealing agent portions 40 is ground and thus, the ground surfaces of the sealing resin 42 in the inlets 40A are aligned with the ground surfaces of the glass substrates 20A, 30A and the sealing agent portions 40. As described before, the sealing resin 42 that is put in the inlets 40A is also provided inside the sealing agent portions 40. Therefore, if a part of the edge surfaces of the sealing resin 42 is ground in the grinding process, the sealing at the inlets of the sealing agent portions 40 is likely to be kept. The liquid crystals 18A are less likely to leak out of the liquid crystal panel 10 after producing of the liquid crystal panel 10.

According to the producing method of this embodiment, each of the first separated bonded substrates is cut into multiple separated bonded substrate pieces for every panel region (a second cutting process) at the same time of performing the grinding process. Hereinafter, each of the separated bonded substrate pieces of the bonded substrate after the second cutting process is referred to as a second separated bonded substrate and the bonded substrate to which the grinding process is subjected to in addition to the second cutting process is referred to as aground bonded substrate 50B (see FIG. 9). Specifically, in the second cutting process, the first separated bonded substrate 50A illustrated in FIG. 8 is cut along lines (a dot and dash line extending in the Y-axis direction in FIG. 8) that are scribing lines SL2 with scribing using a scribing wheel, which is not illustrated. The first separated bonded substrate 50A is defined into five sections with respect to the X-axis direction with the scribing lines SL2. The first separated bonded substrate 50A is divided into five second separated bonded substrates 50B.

In the grinding process, the grinding operation is performed until a width dimension of the sealing agent portions 40 is reduced. Accordingly, the width dimension of the sealing agent portions 40 is small at the curved edge surfaces of the five liquid crystal panels 10 that are produced from the first separated bonded substrates 50A. Therefore, the five liquid crystal panels 10 to be produced have a reduced frame width. In the grinding process, the grinding operation is performed on the curved edge surfaces along the outline of each liquid crystal panel 10 to be produced such that the plan view outline of the processed edge surface after the grinding process is curved. In this embodiment, the curved edge surfaces are processed with grinding using the grinder 60. Therefore, a crack is less likely to be produced unintentionally near the curved edge surfaces compared to a method where the curved edge surface is processed with scribing. Therefore, by performing the grinding process and the second cutting process, the ground bonded substrate 50B having the curved edge surface that is processed precisely and having a precise shape is formed.

After performing the grinding process and the second cutting process, the polarizing plates 10C, 10D are attached to the respective outer surfaces of the glass substrates 20A, 30A of the respective ground bonded substrates 50B (see FIG. 9) and the IC chip 12 is mounted on each mounting area A3 such that thirty liquid crystal panels 10 according to this embodiment are produced.

As described before, according to the method of producing the liquid crystal panel 10 of this embodiment, in the bonding process, the glass substrates 20A and 30A are bonded to each other via the sealing agent portions 40 each of which is partially cut off. In the first cutting process, the bonded substrate 50 is cut into multiple bonded substrate pieces such that multiple thin film patterns are arranged linearly. With such a configuration, in the liquid crystal injection process, the liquid crystals 18A are collectively injected into spaces within the respective sealing agent portions 40 surrounding the respective thin film patterns. In the grinding process thereafter, portions of the glass substrates 20A, 30A that are outside the thin film patterns on the first separated bonded substrates 50A are collectively ground along the outlines of the display panels to be produced. Accordingly, the edge surfaces of the liquid crystal panels 10 having curved outlines are collectively formed. Therefore, the process of producing the liquid crystal panels 10 each having the liquid crystal layer 18 is shortened compared to the configuration in which the liquid crystals are injected into a space within each of the sealing agent portions disposed on a bonded substrate one by one and the bonded substrates are processed one by one to form the edge surfaces of the liquid crystal panel.

Further, according to the producing method of this embodiment, the first separated bonded substrates 50A are collectively ground to form the curved edge surfaces of the liquid crystal panels 10 having curved outlines. Therefore, as described before, unintentional cracks are less likely to be produced near the edge surfaces and each of the liquid crystal panels 10 to be produced has an outline with good precision. As described before, in the method of producing the liquid crystal panels 10 including the liquid crystal layers 18 according to this embodiment, the liquid crystal panels 10 having curved outlines with good precision are collectively produced while shortening the producing process.

In the producing method according to this embodiment, in the first cutting process, the linear cut lines CL1 are formed on the first glass substrate 20A of the bonded substrate 50 at a border portion between the mounting areas A3 of the liquid crystal panels 10 to be produced and other areas, and a part of the first glass substrate 20A is removed along each of the cut lines CL1 from the bonded substrate at the same time of forming the cut lines CL1. Thus, the mounting areas A3 of the liquid crystal panels 10 to be produced are provided without performing the cutting operation for producing the mounting areas A3 after the grinding process.

Second Embodiment

Figure 10:
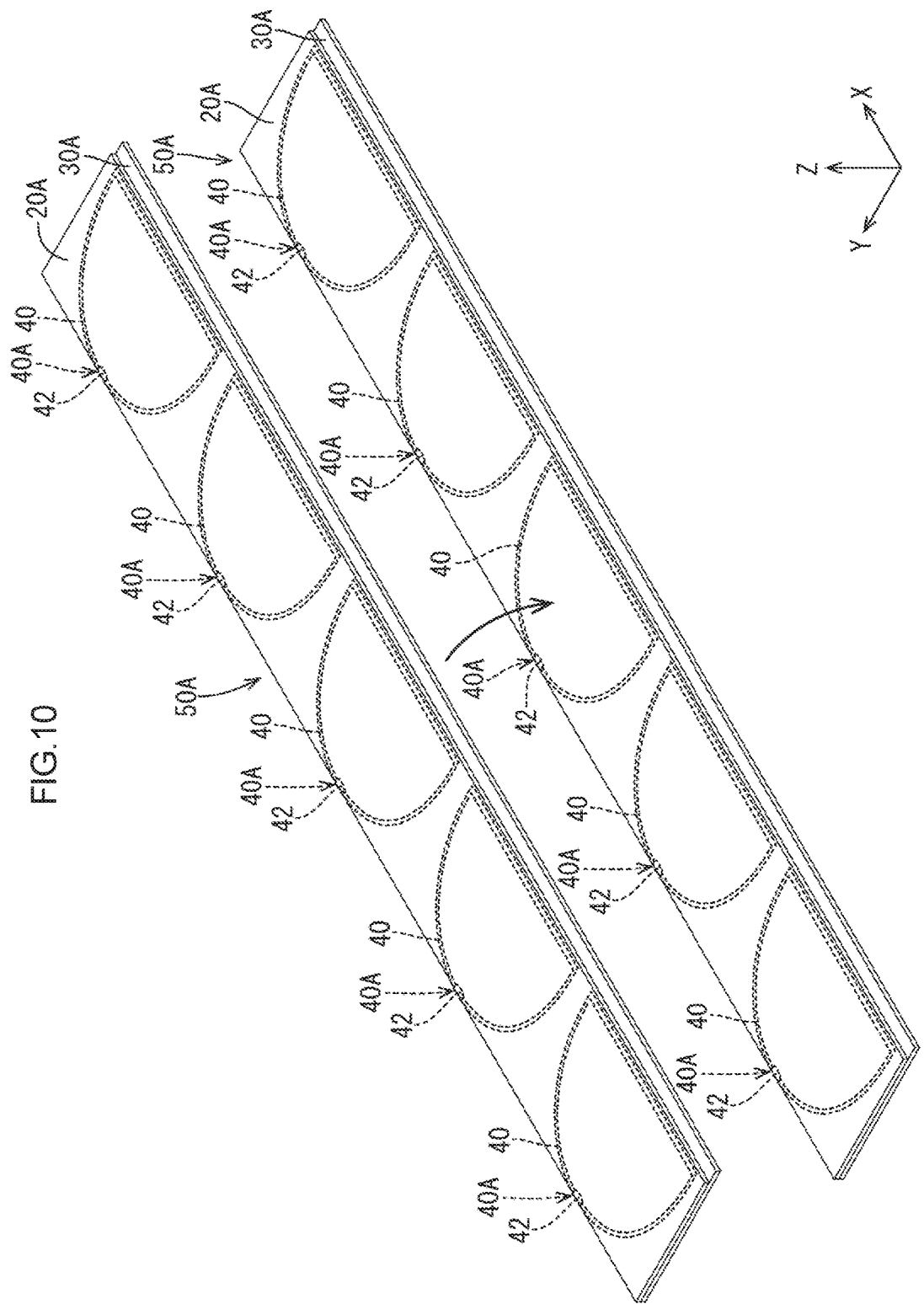
FIG. 10 is a perspective view illustrating a layering process according to a second embodiment.

A second embodiment will be described with reference to FIGS. 10 to 13. In the second embodiment, a producing process is further shortened compared to the method of producing the liquid crystal panel of the first embodiment. In the producing method of this embodiment, after the sealing process and before the second cutting process and the grinding process, two first separated bonded substrates 50A are layered via curing resin 170 (see FIG. 11) (a layering process) as illustrated in FIG. 10. In the layering process, the two first separated bonded substrates 50A are overlapped in a plan view with and positioned with using alignment marks (not illustrated) provided on the respective first separated bonded substrates 50A. The curing resin 170 used in the layering process is two-part liquid resin including two kinds of liquid resin that are to be mixed and cured.

The two-part liquid resin of the curing resin 170 preferably includes one resin containing organic peroxide and another resin containing a decomposition promoter. At least one of the resins preferably contains photopolymerization initiator that is cured by ultraviolet rays. Specific components and a use amount of the organic peroxide, specific components and a use amount of the decomposition promoter, and specific components and a use amount of the photopolymerization initiator are described in Japanese Translation of PCT International Application Publication No. 2013/011969. For reference, the entire contents of Japanese Translation PCI International Application Publication No. 2013/011969 are incorporated herein by reference.

In the layering process, after the two first separated bonded substrates 50A are layered, pressure is applied to an upper one of the first separated bonded substrates 50A such that bubbles are removed from the curing resin 170 and extra resin is pushed out. Thus, a distance between the two first separated bonded substrates 50A is substantially constant. Then, the two first separated bonded substrates 50A are positioned with each other with using a positioning camera.

In the layering process, if the curing resin 170 containing the photopolymerization initiator is used, every time another first separated bonded substrate 50A is layered on the first separated bonded substrate 50A, the first separated bonded substrates 50A are irradiated with a predefined amount (for example from 50 to 500 mJ/cm$^2$) of ultraviolet rays at four corners of the first separated bonded substrates 50A in a plan view to cure the curing resin 170 at the four corners. The four corners of the layered two first separated bonded substrates 50A are outside the sealing agent portions 10 that surround the respective thin film patterns. Thereafter, one first separated bonded substrate 50A is layered on the layered two (multiple) first separated bonded substrates 50A via the curing resin 170 and the positioning operation and curing of the curing resin 170 are performed. This sequence is repeated and six first separated bonded substrates 50A are layered via the curing resin 170 (see FIG. 11).

Figure 11:
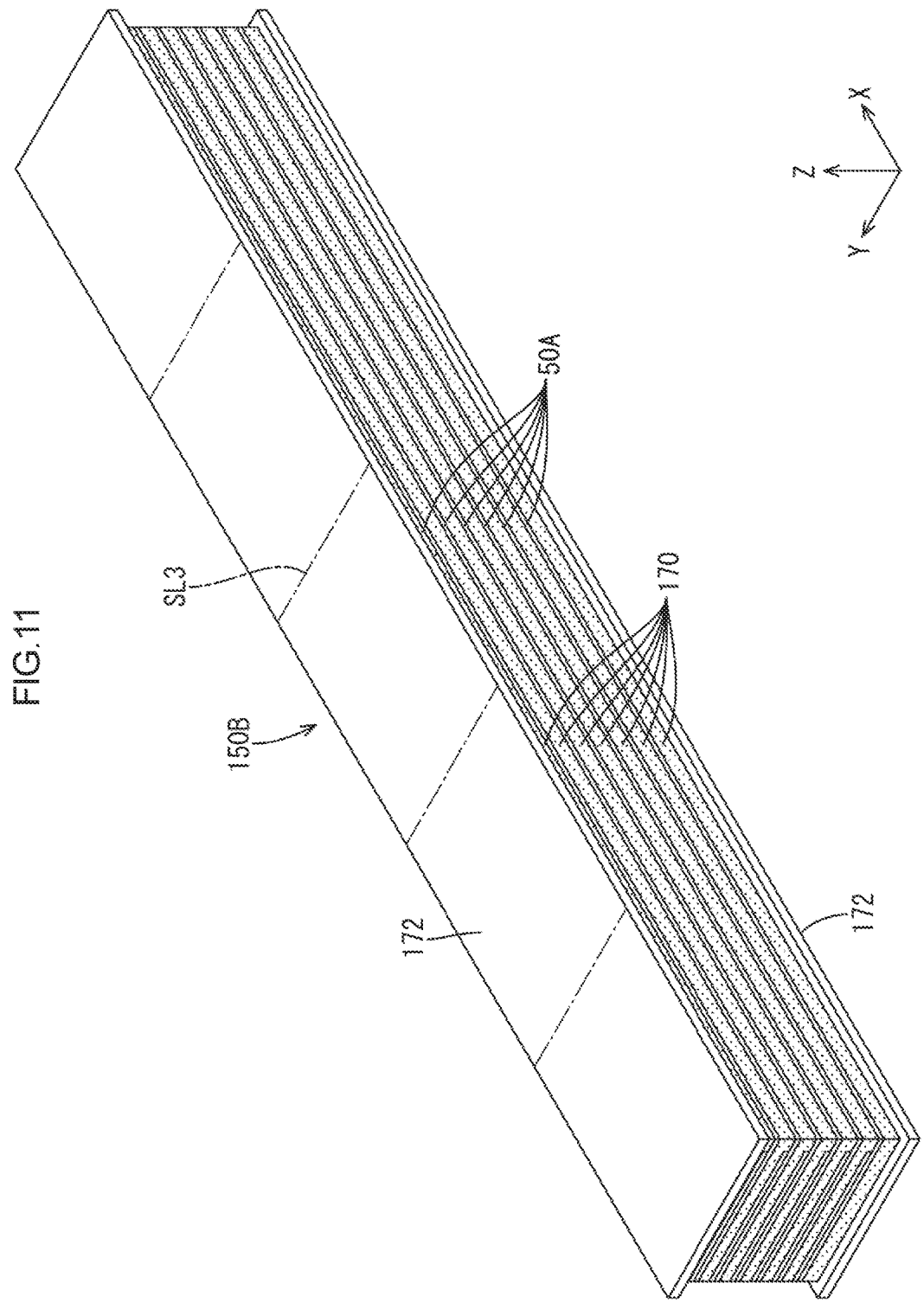
FIG. 11 is a perspective view illustrating a layered substrate.

Thereafter, as illustrated in FIG. 11, the layered six first separated bonded substrates 50A are sandwiched by dummy substrates 112, which are made of glass, via the curing resin 170. Each of the dummy substrates 172 has a plate surface that is greater than a plate surface of the first separated bonded substrate 50A and has a thickness greater than that of the first separated bonded substrate 50A. In the layering process described before, during the process in which the first separated bonded substrates 50A are layered, the two-part liquid resins of the curing resin 170 are mixed and the curing resin 170 is cured with time. Therefore, the first separated bonded substrates 50A that are layered with the curing resin 170 are left for two to twenty four hours such that the curing resin 170 can be effectively cured. In the following, the layered six first bonded substrates 50A and the dummy substrates 172 in a pair sandwiching the layered six first bonded substrates 50A are referred to as a layered substrate 150B. Thirty liquid crystal panels 10 are produced from one layered substrate 150B.

Next, the layered substrate 150B is subjected to the second cutting process. Namely, the layered substrate 150B is cut into multiple separated bonded substrate pieces for every panel region. Hereinafter, each of the separated bonded substrate pieces of the layered substrate 150B after the second cutting process is referred to as a second separated layered substrate 150C and each separated bonded substrate 50 of the second separated layered substrate 150C is referred to as a second separated bonded substrate 50C. Specifically, in the second cutting process, the layered substrate 150B illustrated in FIG. 11 is cut along lines (a dot and dash line extending in the Y-axis direction in FIG. 11) that are cutting lines SL3 with a dicing saw, which is not illustrated. The layered substrate 150B is defined into five sections with respect to the X-axis direction by the cutting lines SL3. The layered substrate 150B is cut into five second separated layered substrates 150C with dicing.

Next, the second separated layered substrate 150C is subjected to the grinding process. Curved edge surfaces of the liquid crystal panels 10 to be produced among the edge surfaces of the second separated layered substrate 150C are ground with using the grinder 60. In the grinding process, in the second separated bonded substrates 50C included in the second separated layered substrate 150C, portions of the glass substrates 20A, 30A, the dummy substrates 172, and the curing resin 170 between the second separated bonded substrates 50C that are outside the thin film patterns are collectively ground along the outline of each liquid crystal panel 10 to be produced. The layered substrate 150B is not necessarily subjected to dicing to obtain the second separated layered substrates 150C but may be ground collectively along the outlines of the curved edge surfaces of the liquid crystal panels 10 for every panel region. Namely, the grinding process may include the second cutting process.

Figure 12:
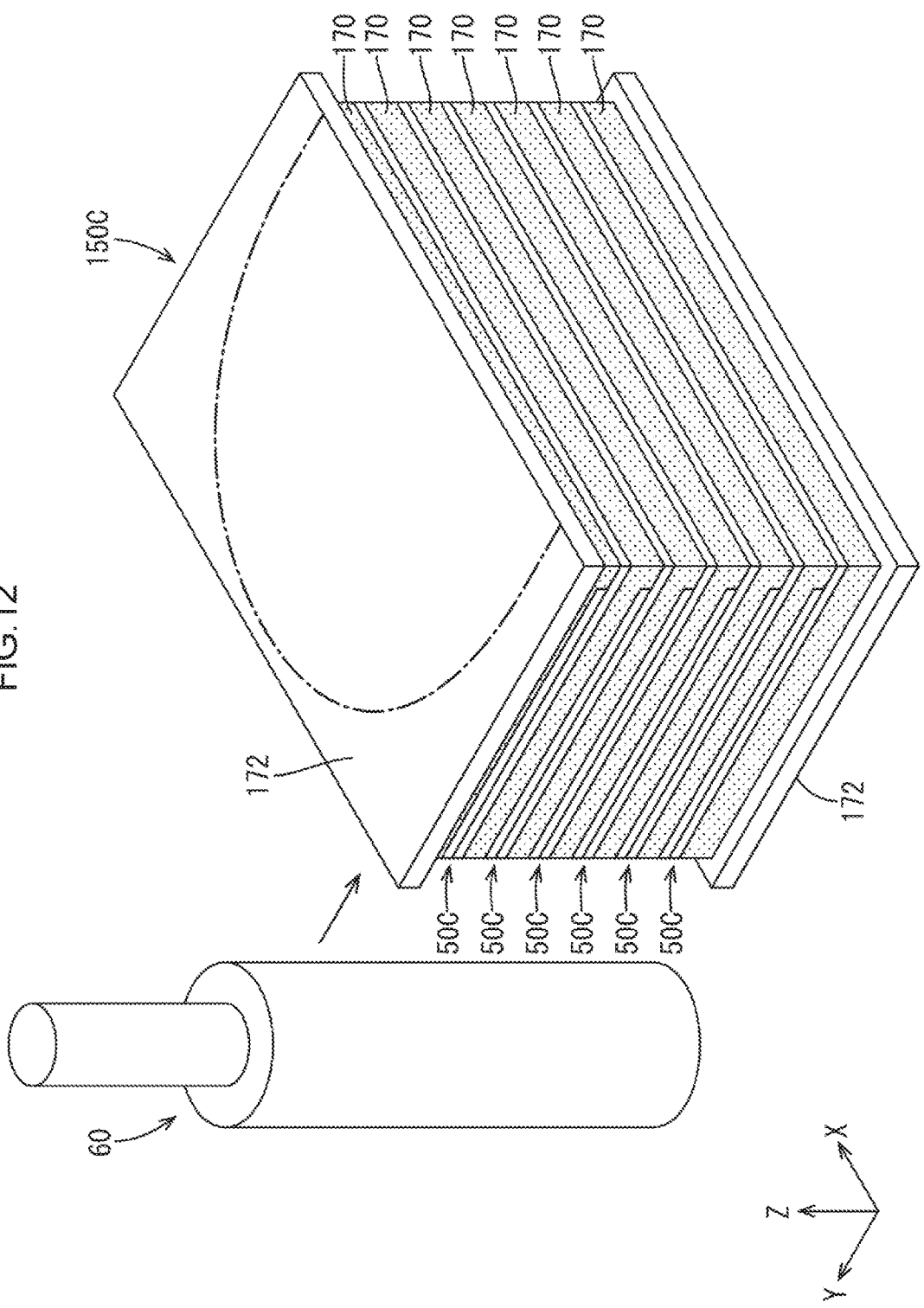
FIG. 12 is a perspective view illustrating a layered substrate after a second cutting process.
Figure 13:
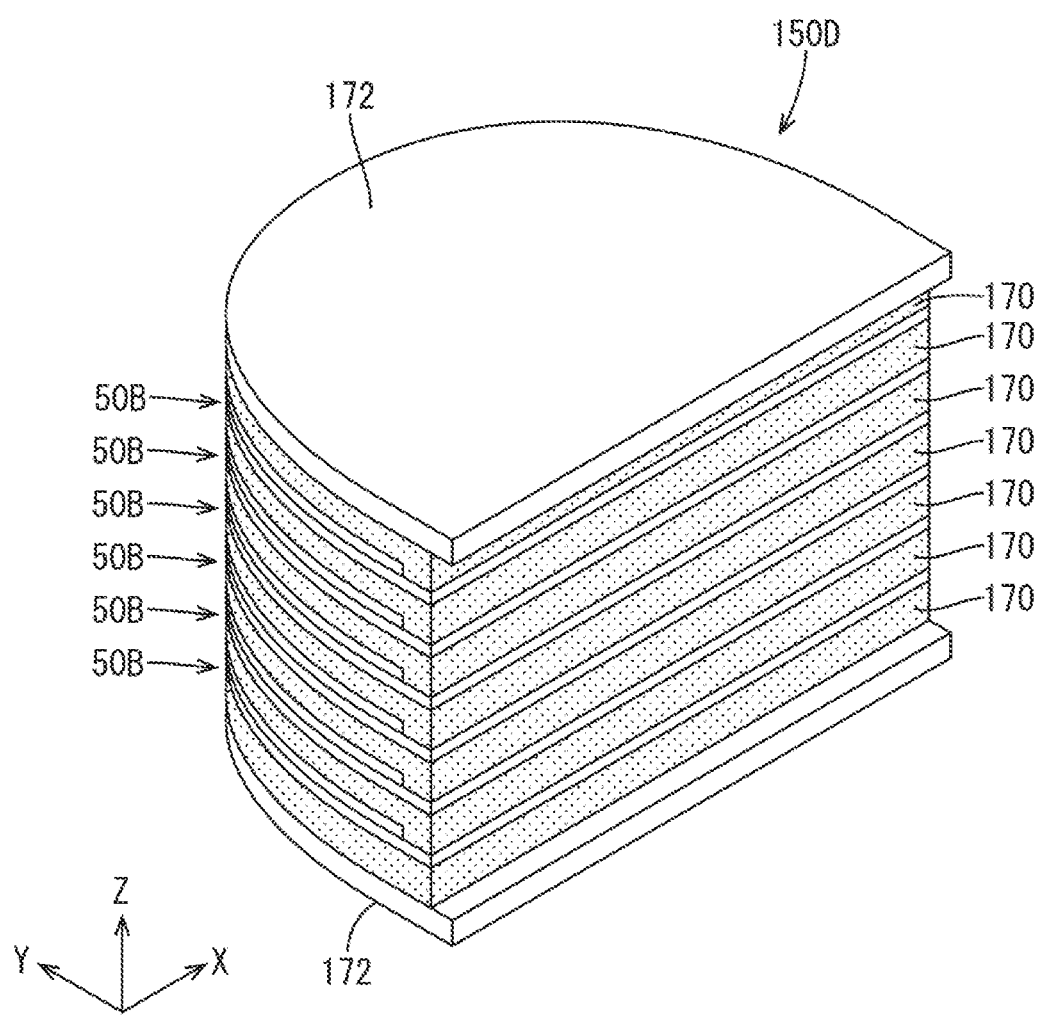
FIG. 13 is a perspective view illustrating a ground layered substrate.

In the second separated bonded substrates 50C included in the second separated layered substrate 150C, after the grinder 60 is moved and reaches a pair of glass substrates 20A, 30A and the sealing agent portions 40 that are overlapped with each other in a plan view, the pair of glass substrates 20A, 30A, the dummy substrates 172, the sealing agent portions 40, and the curing resin 170 are collectively ground along the outline of the curved edge surfaces of the liquid crystal panels 10 to be produced such that grinding surfaces of the glass substrates 20A, 30A and the dummy substrates 172 and the grinding surfaces of the sealing agent portions 40 are aligned with each other. The dot and dashed line of a substantially semicircular shape in FIG. 12 illustrates an outline of the curved edge surface of the second separated layered substrate 150C after the grinding process. In the producing method according to this embodiment, the second cutting process is performed at the same time as the grinding process similar to the first embodiment. Hereinafter, the second separated layered substrate 150C after the grinding process is referred to as a ground layered substrate 150D (see FIG. 9). As illustrated in FIG. 13, the ground layered substrate 150D includes six ground bonded substrates 50B (same as those illustrated in FIG. 9 in the first embodiment), the curing resin 170 between the ground bonded substrates 50B, and the pair of dummy substrates 172 a part of which is ground.

Next, the ground layered substrate 150D is put in a furnace such as an oven and the ground layered substrate 150D is heated for a predefined time (a separation process). The predefined time for heating the ground layered substrate 150D is within a range from three to sixty minutes. Accordingly, the curing resin 170 included in the ground layered substrate 150D is heated and each of the ground bonded substrates 50B is separated from each curing resin 170 and a clearance is produced therebetween. Therefore, in the ground layered substrate 150D that is taken out of the furnace after being heated for the predefined time, each of the ground bonded substrates 50B and the pair of dummy substrates 172 can be easily separate from the curing resin 170. Thereafter, the polarizing plates 10C, 10D are bonded to the outer surfaces of the glass substrates 20A, 30A of the ground bonded substrates 50B, which are separated from the curing resin 170, respectively. The IC chip 12 is mounted on each mounting area A3 and the liquid crystal panel of this embodiment is obtained.

As described before, according to the producing method of this embodiment, in the grinding process, the layered substrate 150B including the first separated bonded substrates 50A that are layered on each other is ground, and in the subsequent separation process, each of the ground bonded substrates 50B of the ground layered substrate 150D is separated from the curing resin 170. Therefore, the process of producing the liquid crystal panels is further shortened compared to the method of processing the first separated bonded substrates 50A one by one and to form each of the edges of the liquid crystal panels.

Third Embodiment

A third embodiment will be described. In a producing method according to this embodiment, the sequence of the processes included in the producing method of the second embodiment is changed. Besides that, the producing method is similar to that of the first embodiment and the second embodiment and the similar processes will not be described. In the producing method of this embodiment, after the sealing process, the second cutting process is performed first and subsequently, the layering process and the grinding process are sequentially performed. Namely, the second cutting process and the layering process are performed in a reverse order from that in the producing method of the second embodiment. Accordingly, the bonded substrate is separated in the second cutting process and therefore, the bonded substrate can be cut easily compared to the second cutting process of the second embodiment in that the layered substrate is cut. The bonded substrates after being subjected to the second cutting process are layered in the layering process and therefore, the bonded substrates can be easily layered on each other compared to the layering process of the second embodiment in that the layered substrates before the second cutting process are layered.

Modifications of each of the above embodiments will be described below.

(1) In each of the above embodiments, the layered substrate is subjected to the grinding process using the grinder in the grinding process. However, the method and the device of performing the grinding process may not be limited thereto.

(2) In each of the above embodiments, in the first cutting process and the second cutting process, the bonded substrate is cut with scribing. However, the method and the device of cutting the bonded substrate may not be limited thereto.

(3) In each of the above embodiments, the liquid crystals are collectively injected into the inside of the sealing agent portions with vacuum injection through the inlets of the sealing agent portions in the liquid crystals injection process. However, the method of injecting the liquid crystals into the inside of the sealing agent portions in the liquid crystals injection process may not be limited thereto.

(4) In each of the above embodiments, the mounting area of the liquid crystal panel has a rectangular shape. However, the shape of the mounting area may not be limited thereto.

The present invention is not limited to the embodiments, which have been described using the foregoing descriptions and the drawings. The embodiments described above are also included in the technical scope of the present invention.

EXPLANATION OF SYMBOLS

10: liquid crystal panel, 12: IC chip, 14: flexible printed circuit board, 18: liquid crystal layer, 18A: liquid crystals, 20: color filter substrate, 20A: first glass substrate, 20L: CF layer, 22: color filter, 24: counter electrode, 30: array substrate, 30A: second glass substrate, 30L: TFT layer, 32: TFT, 34: pixel electrode, 40: sealing agent portion, 40A: inlet, 42: sealing resin, 50: bonded substrate, 50A: first separated bonded substrate, 50B: ground bonded substrate, 50C: second separated bonded substrate, 60: grinder, 150B: layered substrate, 150C: second separated layered substrate, 150D: ground layered substrate, 170: curing resin, 172: dummy substrate, A1: display area, A2: non-display area, A3: mounting area, CL1: cut line, SL1, SL2, SL3: scribing line, SH1, SH2: wheel trace

The invention claimed is:

1. A method of collectively producing display panels each having an outline a part of which is curved, each of the display panels including substrates and a liquid crystal layer disposed on inner surface sides of the respective substrates, the method comprising:
- a sealing agent disposing process of preparing the substrates in a pair one of which has thin film patterns, and disposing sealing agent portions on the one of the substrates to surround the respective thin film patterns and a part of each of the sealing agent portions being cut off;
- a bonding process of bonding the substrates via the sealing agent portions and forming a bonded substrate after the sealing agent disposing process;
- a first cutting process of cutting the bonded substrate into first separated bonded substrate pieces each of which is elongated and includes the thin film patterns linearly arranged, the first cutting process being performed after the bonding process;
- a liquid crystals injection process of collectively injecting liquid crystals for forming the liquid crystal layer to inside of the sealing agent portions through inlets that are cut off parts of the sealing agent portions surrounding the respective thin film patterns that are linearly arranged, the liquid crystals injection process being performed after the first cutting process;
- a sealing process of sealing the inlets of the respective sealing agent portions with sealing resin after the liquid crystals injection process;
- a second cutting process of cutting each of the first separated bonded substrate pieces obtained in the first cutting process into second separated bonded substrate pieces each including a single one of the thin film patterns, the second cutting process being performed after the sealing process;
- a grinding process of collectively grinding the substrates in a pair that are outside the thin film pattern on each of the separated bonded substrate pieces along the outline and collectively forming edge surfaces of the display panels each having the curved outline, the grinding process being performed after the sealing process;
- a layering process of layering the separated bonded substrate pieces via curing resin and curing the curing resin and forming a layered substrate, the layering process being performed after the liquid crystals injection process and before the grinding process; and
- a separation process of separating each of the separated bonded substrate pieces included in the layered substrate from the curing resin, the separation process being performed after the grinding process, wherein
- in the grinding process, in each of the separated bonded substrate pieces, the substrates in a pair and the curing resin that are outside the thin film patterns are ground collectively along the outline.

2. The method of producing the display panels according to claim 1, wherein in the grinding process, in a part of the bonded substrate where the substrates in a pair and the sealing agent portions are overlapped with each other in a plan view, the substrates and the sealing agent portions are collectively ground along the outline such that ground surfaces of the substrates in a pair and ground surfaces of the sealing agent portions are aligned with each other.

3. The method of producing the display panels according to claim 1, wherein in the sealing process, the sealing resin is put in the inlets of the sealing agent portions so as to be extended to inside of the sealing agent portions.

4. The method of producing the display panels according to claim 1, wherein
- the display panel includes a mounting area where driving components for driving the display panel are mounted and that is included in a part of a panel surface area thereof, and
- in the first cutting process,
- a cut line is formed at a border between the mounting area and another area in the panel surface area of the one substrate, and
- a part of the one substrate is removed from each of the first separated bonded substrate pieces along the cut line.

5. The method of producing the display panels according to claim 1, wherein the layered substrate is cut into separated layered substrate pieces in the second cutting process.

* * * * *